United States Patent
Liu et al.

(10) Patent No.: US 9,698,376 B2
(45) Date of Patent: Jul. 4, 2017

(54) PACKAGING METHOD AND PACKAGING STRUCTURE OF SUBSTRATE

(71) Applicant: Shenzhen China Star Optoelectronics Technology Co., Ltd., Shenzhen, Guangdong (CN)

(72) Inventors: Yawei Liu, Guangdong (CN); Chihche Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/340,908

(22) Filed: Nov. 1, 2016

(65) Prior Publication Data

US 2017/0054107 A1    Feb. 23, 2017

Related U.S. Application Data

(62) Division of application No. 14/423,779, filed on Feb. 25, 2015, now Pat. No. 9,530,982.

(30) Foreign Application Priority Data

Oct. 24, 2014    (CN) .......................... 2014 1 0583631

(51) Int. Cl.
| | |
|---|---|
| *H01L 23/02* | (2006.01) |
| *H01L 51/52* | (2006.01) |
| *H01L 27/32* | (2006.01) |
| *H01L 51/56* | (2006.01) |

(Continued)

(52) U.S. Cl.
CPC ........ *H01L 51/5253* (2013.01); *G02F 1/1339* (2013.01); *G02F 1/1368* (2013.01); *G02F 1/13394* (2013.01); *H01L 27/3244* (2013.01); *H01L 51/525* (2013.01); *H01L 51/5246* (2013.01); *H01L 51/56* (2013.01); *H01L 2227/323* (2013.01)

(58) Field of Classification Search
CPC ... H01L 51/56; H01L 51/525; H01L 51/5253; H01L 51/5246; H01L 2924/161
USPC ........................................... 257/98, 680, 434
See application file for complete search history.

(56) References Cited

U.S. PATENT DOCUMENTS

2005/0269926 A1*  12/2005  Fukuoka ............. H01L 51/5246
                                                          313/123
2005/0275079 A1*  12/2005  Stark .................... B81B 7/0067
                                                          257/680

(Continued)

*Primary Examiner* — Nitin Parekh
(74) *Attorney, Agent, or Firm* — Andrew C. Cheng

(57) ABSTRACT

A packaging structure includes a substrate; a displaying component positioned on the substrate; a packaging cover plate arranged opposite to and spaced from the substrate; a loop of first enclosing resin arranged between the substrate and the packaging cover plate to enclose the displaying component and bond the substrate and the packaging cover plate together, where the first enclosing resin contains no spacer particle; and a loop of a second enclosing resin formed on an external circumferential area of the first enclosing resin and located between the substrate and the packaging cover plate, where the second enclosing resin is arranged to have a width smaller than a width of the first enclosing resin and contains therein spacer particles that are sized to define a predetermined spacing distance between the substrate and the packaging cover plate.

13 Claims, 4 Drawing Sheets

(51) Int. Cl.
  *G02F 1/1368* (2006.01)
  *G02F 1/1339* (2006.01)

(56) References Cited

U.S. PATENT DOCUMENTS

| | | | |
|---|---|---|---|
| 2006/0030074 A1* | 2/2006 | Mund | B81C 1/00269 438/108 |
| 2008/0138653 A1* | 6/2008 | Lee | C03C 8/24 428/690 |
| 2012/0025700 A1* | 2/2012 | Ryu | H01L 27/3276 313/512 |
| 2013/0341747 A1* | 12/2013 | Lin | H01L 31/0232 257/432 |
| 2015/0214502 A1* | 7/2015 | Sato | H01L 51/525 257/88 |
| 2015/0263310 A1* | 9/2015 | Gong | H01L 51/5246 257/40 |
| 2015/0264805 A1* | 9/2015 | Chen | H05K 3/0052 361/748 |

* cited by examiner

PACKAGING METHOD AND PACKAGING STRUCTURE OF SUBSTRATE

CROSS REFERENCE TO RELATED APPLICATIONS

This is a divisional application of co-pending U.S. patent application Ser. No. 14/423,779, filed on Feb. 25, 2015.

BACKGROUND OF THE INVENTION

1. Field of the Invention

The present invention relates to the field of displaying technology, and in particular to a packaging method and a packaging structure of a substrate.

2. The Related Arts

In the field of displaying technology, flat panel display technology (liquid crystal display (LCD) and organic light-emitting device (OLED) has gradually take the place of cathode ray tube (CRT) displays. Planar light source technology is a novel light source of which the research and development have been brought to a level close to mass production for marketization. In the technology of flat panel displaying and planar light source, bonding two sheets of flat glass together is a key technique and packaging effectiveness thereof directly affects the performance of a device.

Ultraviolet (UV) curing technology is the earliest and most commonly used technique for LCD/OLED packaging and has the following advantages. No or a small amount of solvent is used so as to reduce pollution to the environment caused by the solvent. Energy consumption is small and curing at a low temperature is available so as to be fit to applications for thermally sensitive materials. Curing speed is great and curing efficiency is high, allowing for applications in high-speed manufacturing lines with the curing facility taking only a small floor area.

As shown in FIGS. 1 and 2, to prevent spacer particles contained in enclosing resin from pressing and damaging thin-film transistors (TFTs) and electrode leads arranged on a TFT substrate 200, packaging is conducted with enclosing resin 300 that does not contain spacer particles. Heretofore, a method for conducting packaging with enclosing resin 300 containing no spacer particles is that enclosing resin 300 that contains no spacer particle is coated on an outer circumferential area of a packaging cover 100 that corresponds to a displaying component 400 formed on a substrate 200; the packaging cover 100 and the substrate 200 are laminated together; and then curing is conducted for the enclosing resin 300 to thereby achieve the packaging of the substrate 200 with the packaging cover 100. However, since there is no constraint imposed by spacer particles, the enclosing resin 300 that does not contain spacer particles may exhibit a resin height and resin width that are hard to control. There might be a difference in resin height and resin width existing between the current set of glass sheets and the previous set or even amongst the glass sheets of the same set.

SUMMARY OF THE INVENTION

An object of the present invention is to provide a packaging method of a substrate and a packaging structure, which uses enclosing resin that does not contain spacer particles outside which enclosing resin containing spacer particles of a height is coated to collectively achieve packaging and cuts and removes portions that comprise the enclosing resin containing spacer particles after the completion of the packaging so as to obtain a substrate packaged with enclosing resin containing no spacer particle and ensure consistency of height and width of the enclosing resin. The manufacturing process is simple and the effect of packaging is good and can effectively prevent spacer particles contained in the enclosing resin from pressing and damaging thin-film transistors and electrode leads provided on the substrate.

To achieve the above object, the present invention provides a packaging method of a substrate, comprising the following steps:

(1) providing a substrate and a packaging cover plate;

(2) coating a loop of first enclosing resin on the packaging cover plate;

(3) coating a loop of second enclosing resin on an external circumferential area of the first enclosing resin on the packaging cover plate;

(4) laminating the packaging cover plate and the substrate together;

(5) applying ultraviolet (UV) light to irradiate the first enclosing resin and the second enclosing resin for curing; and (6) carrying out cutting operations on the substrate and the packaging cover plate to remove portions of the substrate and the packaging cover plate that contact the second enclosing resin so as to achieve packaging of the substrate with the packaging cover plate.

The packaging cover plate is a glass plate and the substrate is a thin-film transistor (TFT) substrate.

In step (2), the substrate comprises a displaying component mounted thereon and the packaging cover plate is provided with a first resin coating position corresponding to an external circumferential area of the displaying component, a first cutting line provided on an external circumferential area of the first resin coating position, and a second resin coating position provided on an external circumferential area of the first cutting line, the first enclosing resin being coated on the first resin coating position.

In step (3), the second enclosing resin is coated on the second resin coating position.

In step (5), the second enclosing resin has a width smaller than a width of the first enclosing resin. The width of the second enclosing resin is 0.2 mm-3 mm. The second enclosing resin has an inner edge located outside the first cutting line.

The first enclosing resin contains no spacer particle and the second enclosing resin contains spacer particles.

The first enclosing resin and the second enclosing resin have the same curing condition.

The substrate is provided with a second cutting line. The second cutting line is set to correspond to a location between the second resin coating position and the first cutting line of the packaging cover plate. The second enclosing resin has an inner edge located outside the second cutting line.

In step (6), a cutting operation is carried out on the packaging cover plate along the first cutting line and a cutting operation is carried out on the substrate along the second cutting line.

The present invention also provides a packaging structure of a substrate, which comprises a substrate, a displaying component positioned on the substrate, a packaging cover plate arranged opposite to the substrate, and first enclosing resin arranged between the substrate and the packaging cover plate to bond the substrate and the packaging cover plate together. The first enclosing resin contains no spacer particle.

The efficacy of the present invention is that the present invention provides a packaging method of a substrate and a packaging structure, which uses enclosing resin that does not contain spacer particles outside which enclosing resin containing spacer particles of a height is coated to collectively achieve packaging and cuts and removes portions that comprise the enclosing resin containing spacer particles after the completion of the packaging so as to obtain a substrate packaged with enclosing resin containing no spacer particle and ensure consistency of height and width of the enclosing resin. The manufacturing process is simple and the effect of packaging is good. The packaging structure uses enclosing resin that does not contain spacer particles to achieve packaging and the height and width of the enclosing rein are maintained consistent. The structure is simple and can effectively prevent spacer particles contained in the enclosing resin from pressing and damaging thin-film transistors and electrode leads provided on the substrate.

For better understanding of the features and technical contents of the present invention, reference will be made to the following detailed description and the attached drawings of the present invention. However, these drawings are provided only for reference and illustration and are not intended to impose undue limitations to the scope of the present invention.

BRIEF DESCRIPTION OF THE DRAWINGS

To make the technical solution and other benefits of the present invention manifest, a detailed description is given to an embodiment of the present with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
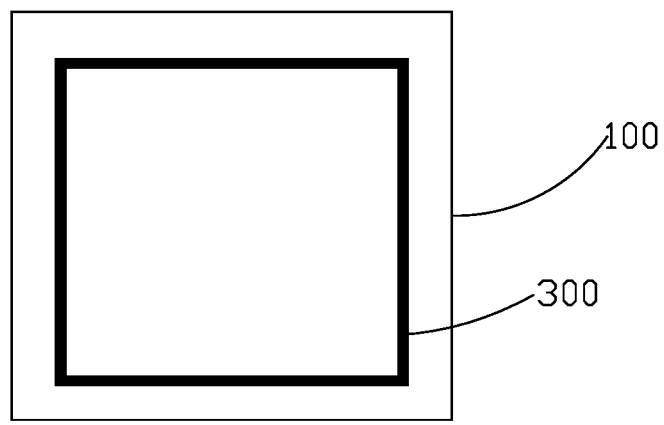
FIG. 1 is a schematic top plan view showing a conventional packaging structure.
Figure 2:
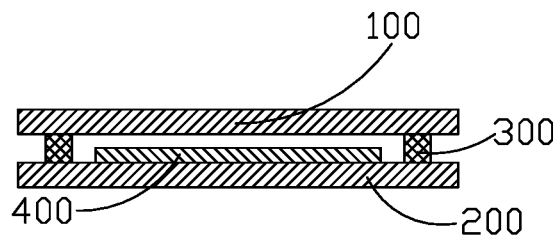
FIG. 2 is a schematic cross-sectional view of the packaging structure shown in FIG. 1.
Figure 3:
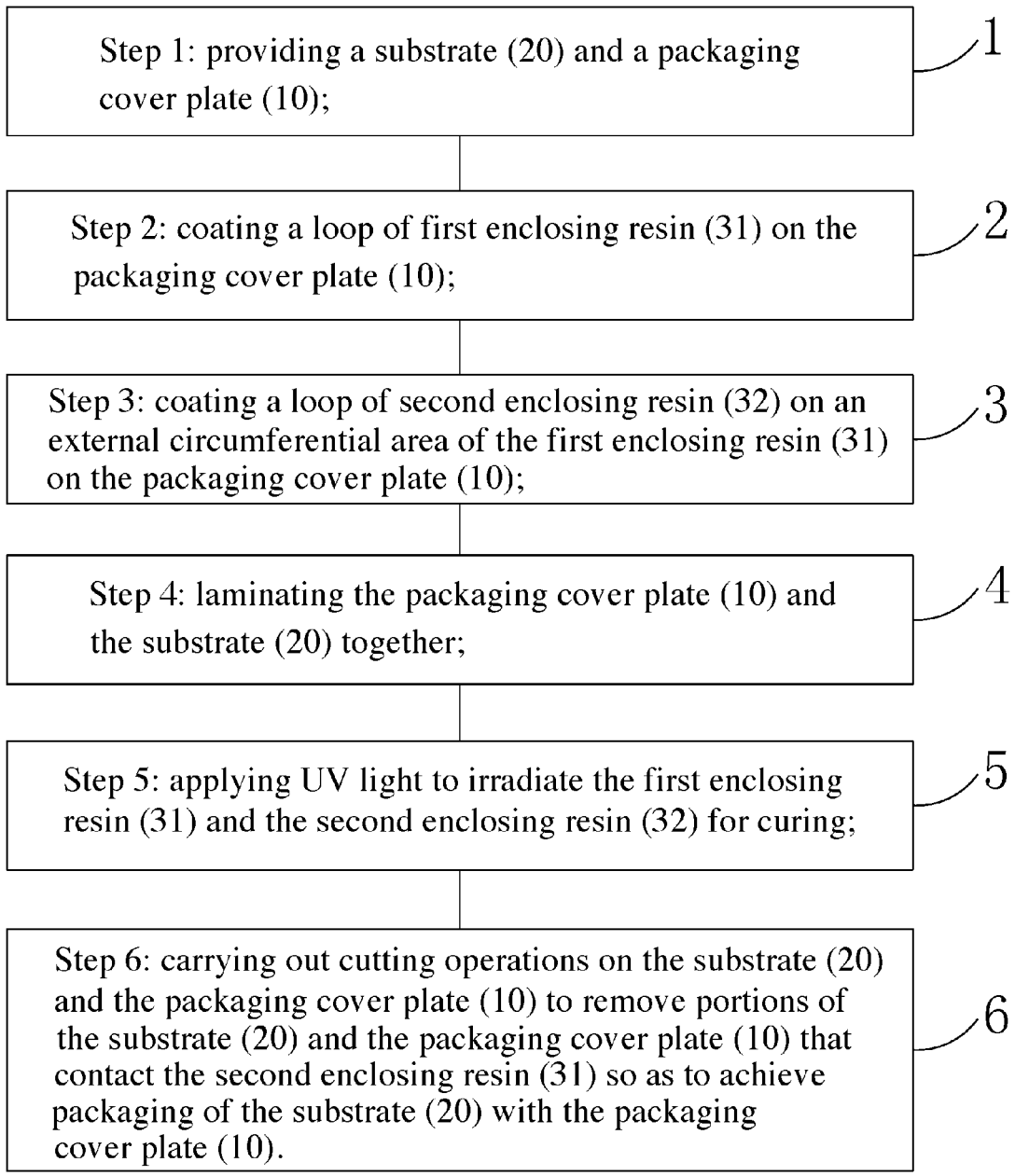
FIG. 3 is a flow chart illustrating a packaging method of a substrate according to the present invention.

Referring to FIG. 3, the present invention provides a packaging method of a substrate, which comprises the following steps:

Step 1: providing a substrate 20 and a packaging cover plate 10.

The packaging cover plate is a glass plate. The substrate 20 is a thin-film transistor (TFT) substrate.

Figure 4:
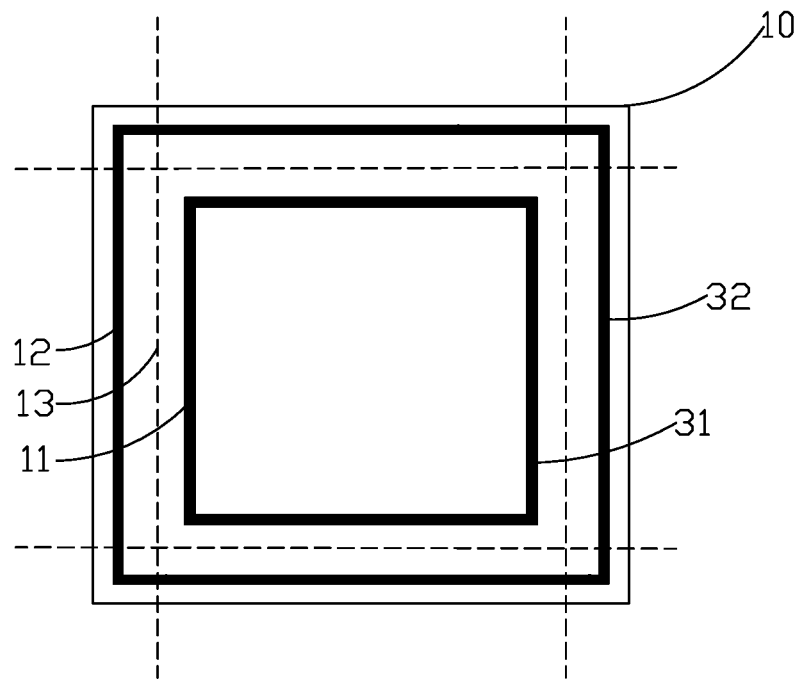
FIG. 4 is a schematic top plan view illustrating a third step of the packaging method of the substrate according to the present invention.

Step 2: as shown in FIG. 4, coating a loop of first enclosing resin 31 on the packaging cover plate 10.

Figure 6:
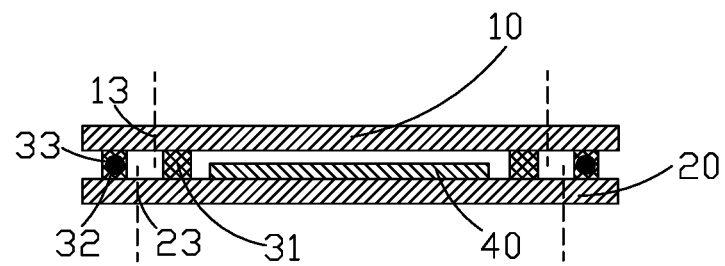
FIG. 6 is a schematic cross-sectional view illustrating a fourth step of the packaging method of the substrate according to the present invention.

Referring simultaneously to FIGS. 4 and 6, the substrate 20 comprises a displaying component 40 mounted thereon.

The packaging cover plate 10 is provided with a first resin coating position 11 corresponding to an external circumferential area of the displaying component 40, a first cutting line 13 provided on an external circumferential area of the first resin coating position 11, and a second resin coating position 12 provided on an external circumferential area of the first cutting line 13. The substrate 20 is provided with a second cutting line 23 and the second cutting line 23 is set to correspond to a location between the second resin coating position 12 and the first cutting line 13 of the packaging cover plate 10.

The first enclosing resin 31 is coated on the first resin coating position 11. The first enclosing resin 31 is an enclosing resin that does not contain spacer particles.

Step 3: as shown in FIG. 4, coating a loop of second enclosing resin 32 on an external circumferential area of the first enclosing resin 31 on the packaging cover plate 10.

Figure 5:
FIG. 5 is a schematic cross-sectional view illustrating the third step of the packaging method of the substrate according to the present invention.

Referring simultaneously to FIGS. 4 and 5, the second enclosing resin 32 is coated on the second resin coating position 12. The second enclosing resin 32 is an enclosing resin that contains spacer particles 33 of a predetermined height. To not affect a subsequent cutting operation, an inside edge of the second enclosing resin 32 is set outside the second cutting line 23.

Step 4: as shown in FIG. 6, laminating the packaging cover plate 10 and the substrate 20 together.

Referring to FIG. 6, the second enclosing resin 32 has a width that is less than a width of the first enclosing resin 31. Since the second enclosing resin 32 is provided only for controlling a gap formed between the substrate 20 and the packaging cover plate 10 after the assembly, there is no need to apply an excessive amount of the resin and the width of the second enclosing resin 32 is controlled between 0.2 mm-3 mm after the lamination.

Step 5: applying ultraviolet (UV) light to irradiate the first enclosing resin 31 and the second enclosing resin 32 for curing.

The first enclosing resin 31 and the second enclosing resin 32 may have the same curing condition.

Step 6: carrying out cutting operations on the substrate 20 and the packaging cover plate 10 to remove portions of the substrate 20 and the packaging cover plate 10 that contact the second enclosing resin 32 so as to achieve packaging of the substrate 20 with the packaging cover plate 10.

Specifically, referring to FIG. 6, a cutting operation is carried out on the packaging cover plate 10 along the first cutting line 13 and a cutting operation is carried out on the substrate 20 along the second cutting line 23. Eventually, the substrate 20 that is packaged with the first enclosing resin 31 that does not contain spacer particles is obtained as illustrated in FIG. 7.

In the lamination of the substrate 20 and the packaging cover plate 10, the spacer particles 33 contained in the second enclosing resin 32 define a gap between the substrate 20 and the packaging cover plate 10 so that it is possible to ensure the height of the first enclosing resin 31 and, under the condition that the amount of resin applied is fixed, the width of the first enclosing resin 31 is also ensured.

Figure 7:
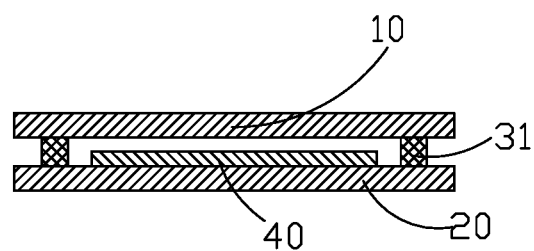
FIG. 7 is a schematic cross-sectional view illustrating a sixth step of the packaging method of the substrate according to the present invention.

The present invention also provides a packaging structure obtained with the above-described packaging method of a substrate, and as shown in FIG. 7, comprising a substrate 20, a displaying component 40 positioned on the substrate 20, a packaging cover plate 10 arranged opposite to the substrate 20, and first enclosing resin 31 arranged between the substrate 20 and the packaging cover plate 10 to bond the substrate 20 and the packaging cover plate 10 together. The first enclosing resin 31 contains therein no spacer particles.

It is noted that the above-described packaging method of a substrate and a packaging structure thereof are applicable to packaging of devices including liquid crystal displays (LCDs), organic light-emitting diodes (OLEDs), and white organic light-emitting diodes (WOLEDs).

In summary, the present invention provides a packaging method of a substrate and a packaging structure, which uses enclosing resin that does not contain spacer particles outside which enclosing resin containing spacer particles of a height is coated to collectively achieve packaging and cuts and removes portions that comprise the enclosing resin containing spacer particles after the completion of the packaging so as to obtain a substrate packaged with enclosing resin containing no spacer particle and ensure consistency of height and width of the enclosing resin. The manufacturing process is simple and the effect of packaging is good. The packaging structure uses enclosing resin that does not contain spacer particles to achieve packaging and the height and width of the enclosing rein are maintained consistent. The structure is simple and can effectively prevent spacer particles contained in the enclosing resin from pressing and damaging thin-film transistors and electrode leads provided on the substrate.

Based on the description provided above, those having ordinary skills of the art may contemplate various changes and modifications according to the technical solution and technical idea of the present invention and these changes and modifications all belong to the protection scope of the present invention.

What is claimed is:

1. A packaging structure, comprising a substrate; a displaying component positioned on the substrate; a packaging cover plate arranged opposite to and spaced from the substrate; a loop of first enclosing resin arranged between the substrate and the packaging cover plate to enclose the displaying component and bond the substrate and the packaging cover plate together, the first enclosing resin containing no spacer particle; and a loop of a second enclosing resin formed on an external circumferential area of the first enclosing resin and located between the substrate and the packaging cover plate, the second enclosing resin being arranged to have a width smaller than a width of the first enclosing resin and containing therein spacer particles that are sized to define a predetermined spacing distance between the substrate and the packaging cover plate;

wherein a first cutting line is provided on the packaging cover plate and the packaging cover plate is adapted to be cut along the first cutting line to remove a circumferential margin portion thereof that is located outside the first cutting line;

wherein a second cutting line is provided on the substrate and the substrate is adapted to be cut along the second cutting line to remove a circumferential margin portion thereof that is located outside the second cutting line; and wherein the second enclosing resin is located outboard the first and second cutting lines such that an inner edge of the second enclosing resin is located outside the first cutting line and the second cutting line and the second enclosing resin is adapted to be removed from both the packaging cover plate and the substrate with the removal of the circumferential margin portions of the packaging cover plate and the substrate.

2. The packaging structure as claimed in claim 1, wherein the second cutting line is located outside the first cutting line.

3. The packaging structure as claimed in claim 1, wherein the second cutting line is located between the first cutting line and the loop of the second enclosing resin.

4. The packaging structure as claimed in claim 1, wherein the packaging cover plate is a glass plate and the substrate is a thin-film transistor (TFT) substrate.

5. The packaging structure as claimed in claim 1, wherein the width of the second enclosing resin ranges between 0.2 mm and 3 mm.

6. The packaging structure as claimed in claim 1, wherein the packaging cover plate is provided with a first resin coating position corresponding to an external circumferential area of the displaying component and the first cutting line is provided on an external circumferential area of the first resin coating position, the first enclosing resin being located on the first resin coating position.

7. The packaging structure as claimed in claim 6, wherein the second enclosing resin is formed on a second resin coating position that is provided on an external circumferential area of the first cutting line.

8. A packaging structure, comprising a substrate; a displaying component positioned on the substrate; a packaging cover plate arranged opposite to and spaced from the substrate; a loop of first enclosing resin arranged between the substrate and the packaging cover plate to enclose the displaying component and bond the substrate and the packaging cover plate together, the first enclosing resin containing no spacer particle; and a loop of a second enclosing resin formed on an external circumferential area of the first enclosing resin and located between the substrate and the packaging cover plate, the second enclosing resin being arranged to have a width smaller than a width of the first enclosing resin and containing therein spacer particles that are sized to define a predetermined spacing distance between the substrate and the packaging cover plate;

wherein a first cutting line is provided on the packaging cover plate and the packaging cover plate is adapted to be cut along the first cutting line to remove a circumferential margin portion thereof that is located outside the first cutting line;

wherein a second cutting line is provided on the substrate and located outboard the first cutting line, the substrate being adapted to be cut along the second cutting line to remove a circumferential margin portion thereof that is located outside the second cutting line; and wherein the second enclosing resin is located outboard the first and second cutting lines such that an inner edge of the second enclosing resin is located outside the first cutting line and the second cutting line and the second enclosing resin is adapted to be removed from both the packaging cover plate and the substrate with the removal of the circumferential margin portions of the packaging cover plate and the substrate.

9. The packaging structure as claimed in claim 8, wherein the second cutting line is located between the first cutting line and the loop of the second enclosing resin.

10. The packaging structure as claimed in claim 8, wherein the packaging cover plate is a glass plate and the substrate is a thin-film transistor (TFT) substrate.

11. The packaging structure as claimed in claim 8, wherein the width of the second enclosing resin ranges between 0.2 mm and 3 mm.

12. The packaging structure as claimed in claim 8, wherein the packaging cover plate is provided with a first resin coating position corresponding to an external circumferential area of the displaying component and the first cutting line is provided on an external circumferential area of the first resin coating position, the first enclosing resin being located on the first resin coating position.

13. The packaging structure as claimed in claim 12, wherein the second enclosing resin is formed on a second resin coating position that is provided on an external circumferential area of the first cutting line.

* * * * *